(12) United States Patent
Mrvos et al.

(10) Patent No.: US 7,368,396 B2
(45) Date of Patent: May 6, 2008

(54) DRY ETCHING METHODS

(75) Inventors: James M. Mrvos, Lexington, KY (US); Girish S. Patil, Lexington, KY (US); Karthik Vaideeswaran, Troy, NY (US)

(73) Assignee: Lexmark International, Inc., Lexington, KY (US)

( * ) Notice: Subject to any disclaimer, the term of this patent is extended or adjusted under 35 U.S.C. 154(b) by 55 days.

(21) Appl. No.: 11/173,395

(22) Filed: Jul. 1, 2005

(65) Prior Publication Data

US 2007/0004215 A1   Jan. 4, 2007

(51) Int. Cl.
*H01L 21/302* (2006.01)
*H01L 21/461* (2006.01)

(52) U.S. Cl. ............... 438/745; 438/689; 438/712

(58) Field of Classification Search .......... 438/689, 438/712, 745
See application file for complete search history.

(56) References Cited

U.S. PATENT DOCUMENTS

| | | | |
|---|---|---|---|
| 4,788,127 A | 11/1988 | Bailey et al. | |
| 5,286,599 A | 2/1994 | Babich et al. | |
| 5,897,333 A | 4/1999 | Goossen et al. | |
| 6,110,393 A | 8/2000 | Simmons et al. | |
| 6,207,353 B1 | 3/2001 | Armacost et al. | |
| 6,245,594 B1 | 6/2001 | Wu et al. | |
| 2002/0000517 A1* | 1/2002 | Corso et al. | 250/288 |
| 2003/0017420 A1 | 1/2003 | Mahorowala | |
| 2003/0199613 A1* | 10/2003 | Ninomiya et al. | 523/160 |
| 2004/0018451 A1 | 1/2004 | Choi | |
| 2006/0071210 A1* | 4/2006 | Yamazaki et al. | 257/57 |
| 2006/0146092 A1* | 7/2006 | Barnes et al. | 347/54 |

FOREIGN PATENT DOCUMENTS

EP            342737            11/1989

* cited by examiner

*Primary Examiner*—Nadine G. Norton
*Assistant Examiner*—Mahmoud Dahimene
(74) *Attorney, Agent, or Firm*—Leudeka, Neely and Graham PC

(57) ABSTRACT

A process for etching semiconductor substrates using a deep reactive ion etching process to produce through holes or slots (referred to collectively as "slots") in the substrates. The process includes applying a first layer to a first surface of substrate to provide an etch mask material layer on the first surface of the substrate. A second layer is applied to a second surface of the substrate to provide an etch stop material layer on the second surface of the substrate. The first layer and the second layer have similar solubilities in one or more organic solvents. The substrate is etched from the first surface of the wafers to provide a slot in the substrate. After etching the substrate, the etch mask material layer and the etch stop material layer are removed by contacting the first surface and the second surface of the substrate with a single organic solvent.

7 Claims, 5 Drawing Sheets

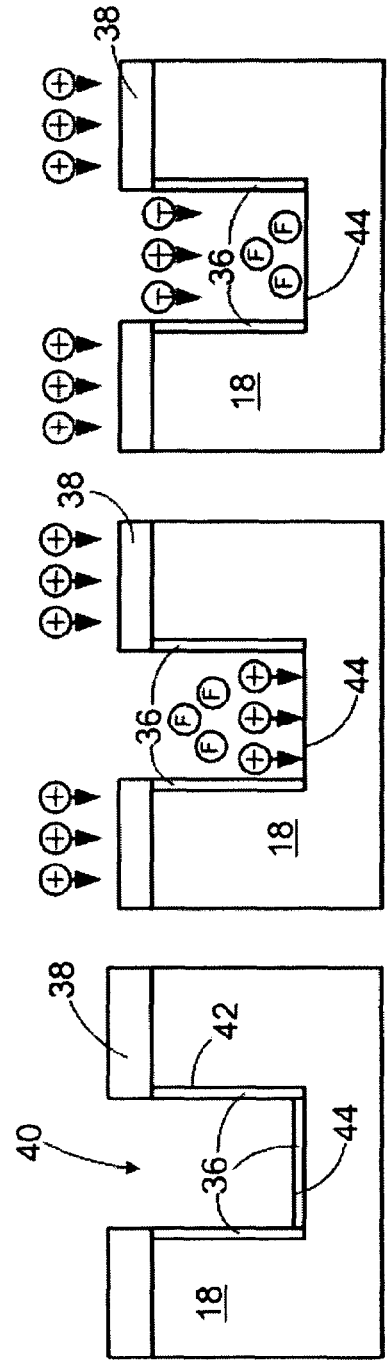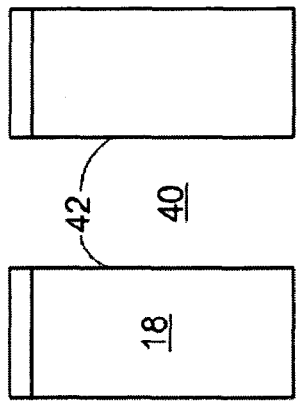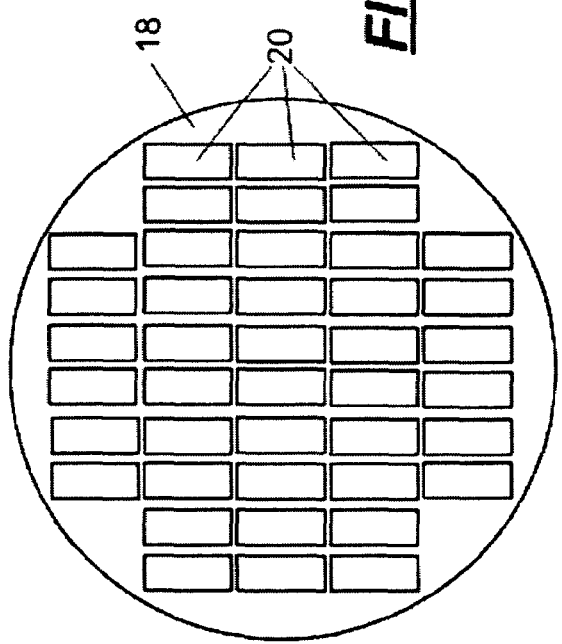

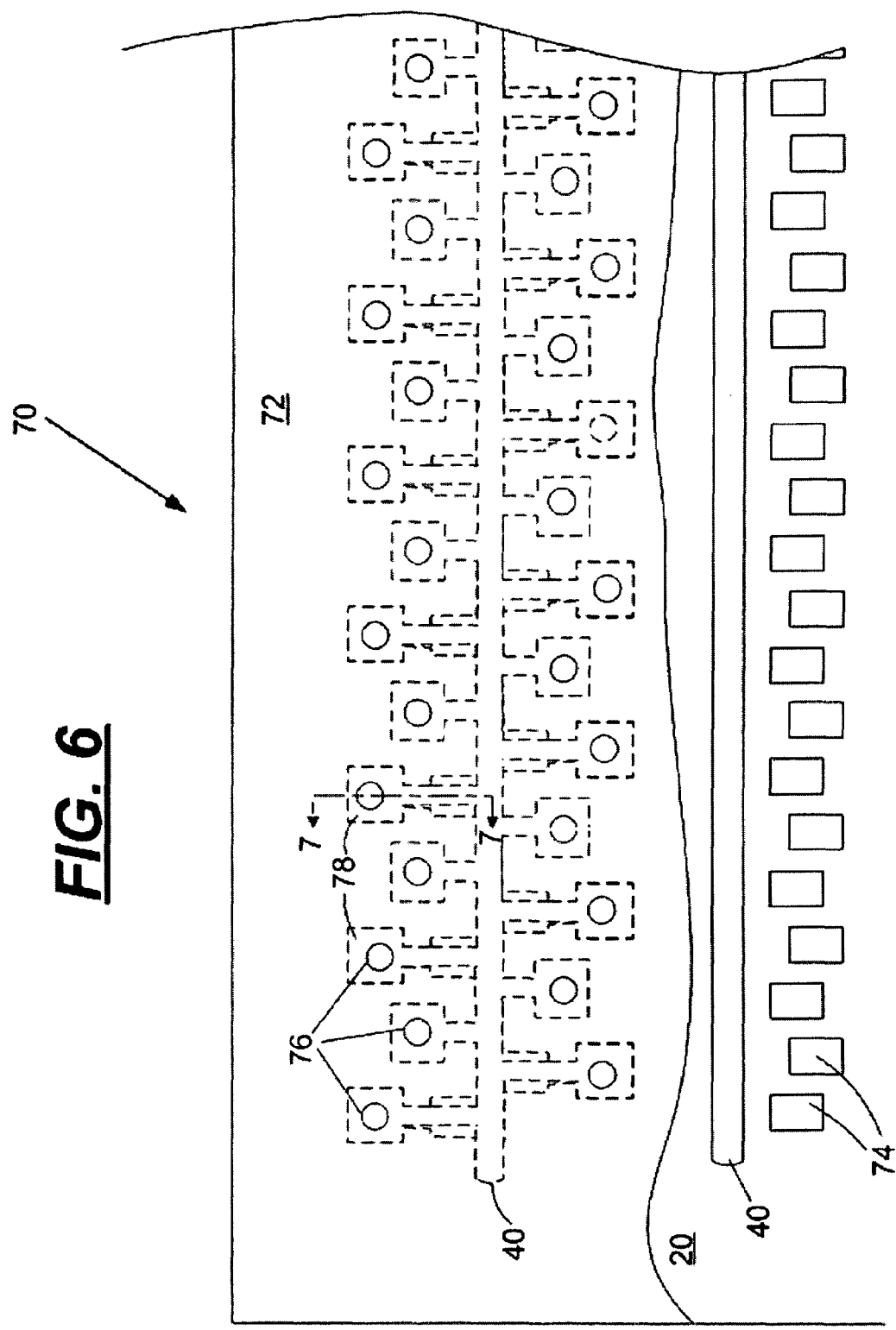

DRY ETCHING METHODS

FIELD OF THE DISCLOSURE

The disclosure relates to etching processes and in particular improvements in deep reactive ion etching processes.

BACKGROUND AND SUMMARY

Semiconductor substrates are used in a wide variety of applications. For example, semiconductor substrates having a slot formed therethrough may be used to provide ejection actuators for micro-fluid ejection heads. Slots in a silicon wafer containing multiple substrates may be formed by a variety of micro-machining techniques including, but not limited to, sand blasting, chemical wet etching, dry etching, laser cutting, and the like. Deep reactive ion etching (DRIE) of slots through silicon wafers offers significant advantages over other technologies such as grit blasting, laser cutting, and wet etching. Specifically, the DRIE process provides better dimensional control of the topside and backside openings compared to the grit blasting process. In addition, chips with a slot formed by the DRIE process are approximately 5 times stronger in 3-point bend testing than grit blasted chips.

When compared to wafers that have slots etched therethrough using KOH or TMAH in a wet chemical process, wall angles of the slots may be much smaller using the DRIE process. For example, re-entrant wall angles between 0° and 8° may be achieved with a DRIE process whereas wet processes produce wall angles of 54.7° in <100> silicon. Hence, DRIE processes for slots may provide a more efficient use of silicon.

The DRIE process for etching slots through a thickness of a semiconductor substrate wafer includes a series of sequential steps of alternating etching and passivation. Such dry etching techniques are described in U.S. Pat. Nos. 5,611,888 and 5,626,716 to Bosch et al., the disclosures of which are incorporated herein by reference.

During deep reactive ion etching (DRIE) of semiconductor wafers, the wafers are positioned and held in place on an electrostatic clamping disk. The clamping disk uses a DC power source to induce a charge on the surface of the wafer to be etched. The charge on the wafer provides an electrostatic force that pulls the wafer onto the clamping disk. As opposed to mechanical clamping, an electrostatic clamping mechanism increases a surface area of the wafer available for etching.

The clamping disk also includes a cooling mechanism for cooling a back side of the wafer during the DRIE etching process. The cooling mechanism provides helium gas which flows through channels in the clamping disk to the back side of the wafer. Helium gas serves as a heat transfer medium between the wafer and the clamping disk.

If DRIE etching of the wafers is used to form slots through a thickness of the wafers, an etch stop material must be used on the back side of the wafers to protect the clamping disk from an etching plasma generated during the DRIE process and to prevent escape of helium gas used to cool the back side of the wafers. The escape of helium gas can cause inadequate cooling of the wafers during the etching process, and/or the wafers may be pushed off of the clamping disk by an increase in helium pressure to compensate for helium gas escape.

Various etch stop materials may be applied to the back side of the wafers to protect the clamping disk from damage and to prevent the escape of helium gas. Of the etch stop materials that may be used, relatively hard etch stop materials provide the best protection for the clamping disk. However, relatively hard etch stop materials are difficult to completely remove from the back side of the wafers once the etching process is complete.

Relatively, soft etch stop materials, such as photoresist polymers, are easier to remove from the back side of the wafers. However, under etching conditions, degradation products or a film residue from the relatively soft etch stop materials may accumulate on the clamping disk making it difficult to adequately clamp and seal the wafers on the clamping disk. The residue may also interfere with the flow of cooling gas to the back side of the wafers and may reduce thermal conduction between the wafers and the clamping disk. Removal of the residue may require significant downtime for the etching system thereby reducing product yield. Accordingly, improved methods for DRIE etching of wafers are needed to improve product yield and reduce problems associated with use of apparatus for DRIE etching of wafers.

With regard to the foregoing, the disclosure provides a process for etching semiconductor substrates using a deep reactive ion etching process to produce through holes or slots (referred to hereafter collectively as "slots") in the substrates (which may be collectively part of a wafer of semiconductor substrates). The process includes applying a first layer to a first surface of substrate to provide an etch mask material layer on the first surface of the substrate. A second layer is applied to a second surface of the substrate to provide an etch stop material layer on the second surface of the substrate. The first layer and the second layer have similar solubilities in one or more organic solvents. The substrate is etched from the first surface of the wafers to provide a slot in the substrate. After etching the substrate, the etch mask material layer and the etch stop material layer are removed by contacting the first surface and the second surface of the substrate with a single organic solvent.

Advantages of the exemplary embodiments described herein may include the ability to protect semiconductor substrate during a dry etching process with materials that are easily removed once the etching process is complete. Since the etch mask material and the etch stop material are soluble in a single organic solvent, the process for removing the etch mask and etch stop from the substrate is substantially simplified since only one substrate solvent contact step is required. Another advantage is that a wider variety of etch stop materials may be used that have an increased resistance to residue formation on the clamping disk thereby reducing interference in the flow of cooling gas to the back side of the substrate and improving a seal between the substrate and the clamping disk.

BRIEF DESCRIPTION OF THE DRAWINGS

Further features and advantages of the disclosed embodiments will become apparent by reference to the detailed description when considered in conjunction with the figures, which are not to scale, wherein like reference numbers indicate like elements through the several views, and wherein:

FIG. 2 is a plan view, not to scale, of a semiconductor wafer containing a plurality of semiconductor substrates;

FIGS. 3A-3C are schematic diagrams of a dry etching process;

FIG. 4 is a cross-sectional view, not to scale, of a slot made in a substrate by a dry etching process;

FIG. 6 is a plan view, not to scale, of a portion of a micro-fluid ejection head.

DETAILED DESCRIPTION OF PREFERRED EMBODIMENTS

Figure 1:
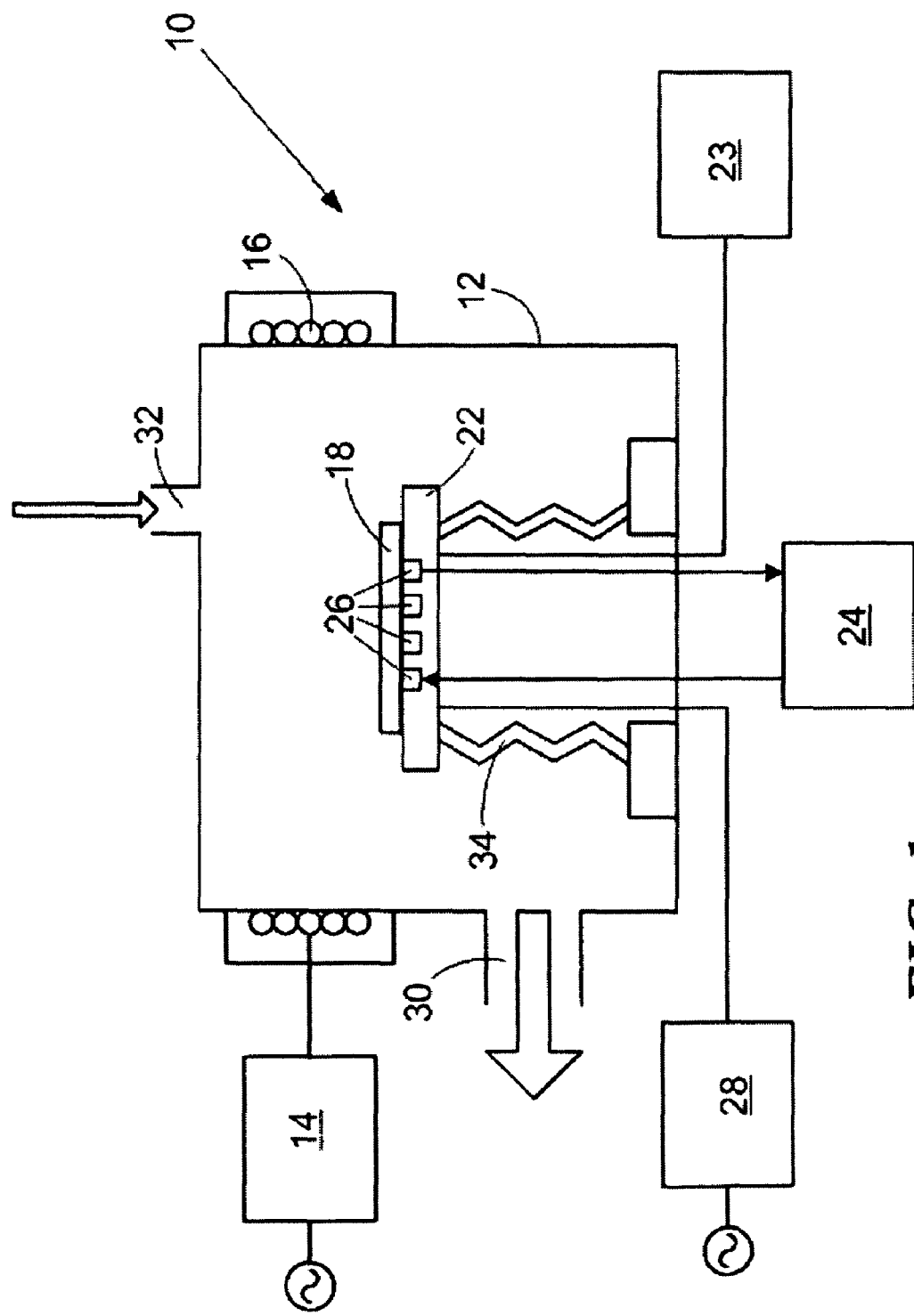
FIG. 1 is a schematic diagram of a deep reactive ion etching system.

As mentioned above, both the etch mask layer and etch stop layer are removed after the etch process is complete. A single organic solvent may be used to strip both the etch mask layer and etch stop from the substrate. As solubility parameters for the etch stop layer and etch mask layer approach one another, a stripping efficiency for the substrate increases.

The stripping efficiency for the substrate is dependent on the properties of the materials used for the etch mask layer, the etch stop layer, and the stripping solvent. For example, organic materials interact with each other in three major ways.

(1) Non-polar interactions which are derived from atomic forces.

(2) Permanent dipole interactions or polar interactions (3) Hydrogen bonding induced interactions A useful method for determining interactions between organic materials is by use of solubility parameters for the materials. There are two major solubility parameters that may have application for selecting etch mask materials, etch stop materials, and suitable solvents therefor, namely a Hansen solubility parameter (HSP) and a Hildenbrand solubility parameter.

For the purposes of the disclosure, the "Hildenbrand solubility parameter" is a numerical value that indicates the relative solvency behavior of a specific solvent. The Hildenbrand solubility parameter is derived from the cohesive energy density of the solvent, which in turn is derived from the heat of vaporization. The "Hansen solubility parameter" (HSP) is provided by dividing the total Hildenbrand solubility parameter value into three parts: a dispersion force component, a hydrogen bonding component, and a polar component.

Solubility predictions made using these two different parameters do not always agree with each other. One can easily see that if two different polymers are used for the etch mask layer and the etch stop layer the polymers may have a similar HSP but a different Hildenbrand solubility parameter. Divergence in the two different solubility parameters may negatively impact the solubility and hence strippability of the materials used for the mask and etch stop layers. Divergence may also mean that two different solvents in two different process steps might have to be used to effectively remove both the layers. On the other hand, if the same polymer is used for both the etch mask layer and the etch stop layer, both layers will have the same HSP and Hildenbrand solubility parameter. Selection of such materials would be the best for stripping the etch mask layer and the etch stop layer from the substrate.

However, the etch mask layer is typically required to be photoimageable and developable, whereas the etch stop layer does not require such characteristics. The etch mask material is commonly used to protect the substrate during a dry etching process and to define the areas of the substrate to be etched, while an etch stop material is commonly used to protect an electrostatic chuck from plasma etching gases used during the etching process. Photoimageable materials tend to provide relatively soft etch stop layers which may cause deposits on the clamping disk of the dry etcher. As described in more detail below, the disclosure provides selection criteria for selecting suitable etch stop layers and etch mask layers having the foregoing characteristics.

A schematic diagram of a DRIE system 10 is illustrated in FIG. 1. The system 10 includes a ceramic reaction chamber 12 and a radio frequency (rf) unit 14 for providing source power to a coil 16 to generate a plasma in the reaction chamber 12. A wafer 18 for providing a plurality of semiconductor substrates 20 (FIG. 2) is disposed in the chamber 12 on a temperature controlled clamping disk 22. A direct current (DC) power unit 23 provides an electrostatic clamping force for holding the wafer on the clamping disk 22.

The temperature of a back side of the wafer 18 adjacent the clamping disk 22 is controlled by a refrigeration unit 24 which provides heat removal from helium gas flowing through gas flow channels 26 on a surface of the clamping disk 22. A clamping disk power unit 28 provides rf biasing power to the clamping disk 22 during the etching process.

The chamber 12 is maintained at a subatmospheric pressure during etching by a vacuum pumping unit coupled to a vacuum port 30. A reactive gas is introduced into the chamber through a gas inlet port 32. A bellows system 34 provides a gas tight seal arrangement for the chamber 12 so that a height of the clamping disk 22 may be adjusted during the etching process.

During the etching process for etching semiconductor substrates 20, the system 10 provides electromagnetic energy to gaseous species within the chamber 12 by applying power to the rf coil 16 wrapped around a dielectric portion of the chamber 12. As current oscillates in the coil 16 very little power dissipation is realized prior to plasma ignition resulting in an ever increasing floating potential difference across the coil 16. The potential difference across the coil 16 provides capacitive coupling of the coil to the dielectric portion of the chamber 12 resulting in an electric field. Eventually the floating potential difference reaches a threshold limit. At the threshold limit, voltage breakdown occurs rendering an ionic mixture including radicals, electrons and emitted photons from a previously neutral gas. The ionic mixture is a luminescent gas generally called a plasma.

Any gas, under the right conditions will form a plasma. However gases used in etching or deposition are chosen strategically to affect particular substrates in a prescribed manner. For example, silicon etching is primarily accomplished in the presence of fluorine or fluorine evolving gases such as sulfur hexafluoride ($SF_6$). Sulfur hexafluoride undergoes ionization according to the following reaction:

$$SF_6 + e^- \rightarrow S_xF_y^+ + S_xF_y^* + F^* + e^{31} \tag{1}$$

thereby producing the reactive fluorine radicals which react with silicon according to the following reaction:

$$Si + F^* \rightarrow SiF_x \tag{2}$$

to produce a volatile gas. A reaction of the fluorine radicals with silicon isotropically etches the silicon.

Isotropic etching, however, is geometrically limited. To produce high aspect ratio features in a silicon substrate with predominantly vertical walls, a directional or anisotropic etch is required. In order to produce vertical walls, the (DRIE) process is used. The DRIE process includes alternating etching and passivating cycles as shown in FIGS. 3A-3C wherein a fluorocarbon polymer ($nCF_2$) is generated to provide a passivating layer 36 during the passivating cycles of the process. In an exemplary embodiment, cycling times for each step may range from about 3 to about 20 seconds. The fluorocarbon polymer is derived from a compound such as octofluorobutane ($C_4F_8$) according to the following reactions:

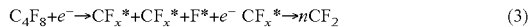

$$C_4F_8 + e^- \rightarrow CF_x^* + CF_x^* + F^* + e^-\ \ CF_x^* \rightarrow nCF_2 \quad (3)$$

Prior to etching a substrate 20, an etch mask 38 (FIGS. 3A-3C) is applied to the substrates 20 to provide a location for a slot 40 in the substrates 20. A process for etching a silicon substrate 20 to form a slot 40 therein is described in U.S. Pat. No. 6,402,301 to Powers et al., the disclosure of which is incorporated herein by reference.

During a passivating step of the process, a $C_4F_8$ gas is introduced into the chamber 12 and a plasma is generated under conditions that enable the fluorocarbon polymer to condense on exposed surfaces of the substrate 20 including on side wall surfaces 42 and bottom surface 44 to provide the passivation layer 36 (FIG. 3A). Substantially immediately following the passivating step, the $C_4F_8$ is evacuated from the chamber 12 and replaced with a reactive etching gas $SF_6$ which forms a reactive plasma under the influence of new, and often radically, different operating conditions (FIG. 3B). As a rule of thumb, for instance, little or no power is applied to the clamping disk 22 during the passivating step as the general intent during this step is to promote condensation of the fluorocarbon polymer uniformly on the side wall surfaces 42 and bottom surface 44 of the substrate 20. Increasing the clamping disk power may reduce condensation of the fluorocarbon polymer on the bottom surface 44 of the substrate 20.

For the etching step of the process, the clamping disk power is increased to promote removal of passivation species from the bottom surface 44 of the forming slot 40. Ions or charged species are influenced by electromagnetic fields with their trajectories substantially tangentially directed along field lines. Because the pertinent field lines are substantially perpendicular to the bottom surface 44 of the developing slots 40, and because passivation removal is generally a line of sight phenomena with areas perpendicular to the side walls 42 receiving a disproportionate share of the ionic bombardment, the passivation layer 36 is removed from the bottom surface 44 of the slot 40 at a much higher rate than from the side walls 42. As a result, the etching rate of the bottom surface 44 is significantly higher than the passivated side walls surfaces 42.

While fluorocarbon polymerization during passivation and disproportionate ionic bombardment at the bottom surface 44 of the slot 40 result in etch directionality, it is the fluorine radical species that is responsible for the actual etching of the substrate 20 (FIG. 3C). Radical species are naturally evolved in plasma chemistries produced in accordance with equation (1) and, in contrast to ions, are typically unaffected by electromagnetic fields with their propagation to the bottom surface 44 driven purely by diffusion. Upon arriving at the bare bottom surface 44 not protected by passivation, radicals spontaneously etch silicon according to equation (2). Therefore etch directionality is a consequence of strategically incomplete passivation removal.

It will be appreciated that the result of each etching cycle is an isotropic etch of the substrate 20. However since the cycle time between the etching and passivating steps is kept relatively short the resulting fluid feed slot 40 has substantially vertical side walls 42 as illustrated by the substrate 20 in FIG. 4. Generally, the smaller the etch step to passivation step ratio and the shorter the overall individual process step cycle time, the more vertical will be the side walls 42 of the slot 40. However, this is an over-simplification of a very complex process. In actuality the geometry of slot 40 is a function of numerous parameters many of which vary non-linearly.

In order to locate and precisely etch features into a substrate 20 using a dry etch process as described above, an etch mask 38 may be used to define the areas to be etched. Since the plasma will etch any exposed substrate 20, specifically desired regions are opened in the etch mask 38 while protecting the remaining areas of the substrate 20. During the etching process, the etch mask 38 will be etched as well as the substrate 20, but at a slower rate. A suitable etch mask material is resistant and thick enough to withstand the entirety of the plasma etching process for the substrate 20.

Typically, there are two main categories of etch masks 38, hard masks and photoresist masks. Hard masks, typically include dielectrics such as silicon oxides, nitrides, and carbides. Such materials are excellent mask materials, however, these materials must first be applied or grown onto the substrate 20 and subsequently patterned to define the region to be dry etched. In general, any remaining hard mask must be removed at the termination of the etching process. Removing the hard mask can be time consuming and difficult.

On the other hand, photoresist materials may be applied to the substrate 20 to provide the etch masks 38, for example, by spinning a layer of photo-sensitive polymer onto the substrate 18. After baking the substrate to drive off excess solvents, the resist mask 38 may be is exposed to ultra violet (UV) light through a glass and chrome mask. The glass and chrome mask has the pattern to be transferred to the resist mask 38 made by the chrome and clear regions of the glass and chrome mask. The chrome areas of the mask block the UV light and the clear areas of the mask allow the UV light to be transmitted to the resist mask 38. The UV light causes a reaction in the resist mask 38, and in the case of negative tone resists, the UV light cross-links the material rendering it insoluble to developer. In the case of positive tone resists, the UV light renders the resist mask 38 soluble in an aqueous base developer. After etching the substrate 20 to form the slot 40, the remaining photoresist mask 38 may be removed by an organic solvent.

Commercially available photoresist materials are complex solutions of polymers, photoacid generators, anti cracking agents and other additives. The formulations for such materials are closely held secrets. As a result, it is difficult to find a commercially available photoresist material that meets the solubility requirements in a solvent as set forth herein.

In FIGS. 5A-5E, an exemplary process for etching slots 40 in a substrate 20 according to the disclosure is illustrated. In a first step of the process, an etch mask 46 is applied to a device layer 48 on a first surface 50 of the substrate 20. The etch mask 46 protects the device layer 48 during the etching process. The etch mask 46 may be provided from a material selected from the group including, but not limited to, epoxy resins, polyhydroxystyrene resins, polyurethane coating materials, acrylic-based coating materials, cresol-novolac resins, polyvinyl acetate coatings, polyester coatings, and polyamide coatings, wherein the material includes a photo-activation catalyst. Such a material may be spin coated, spray-coated, extrusion coated, knife coated, or laminated onto the device layer 48 on the substrate 20. Examples of commercially available etch mask 46 materials include, but are not limited to epoxy based negative resists available from MicroChem Corporation of Newton, Mass. under the trade name SU8, cresol-novolac resins available from Clariant Corporation of Charlotte, N.C. under the trade name AZ 4620, and chemically-amplified polyhydroxystyrene resins available from Shin-Etsu Chemical Co., Ltd. under the trade name SIPR 7121.

In an alternative embodiment, a planarization layer may be interposed between the device layer 48 and the etch mask 46. The device layer 48 may include a plurality of conductive, insulative, resistive, and protective layers, generally as may be found in semiconductor substrates used for ink jet printing applications.

Prior to loading the substrate 20 containing the device layer 48 and the etch mask 46 into the dry etch chamber, an etch stop material is applied to a second surface 52 of the substrate 20 to provide an etch stop layer 54. According to and exemplary embodiment of the disclosure, the etch stop material includes a material that has substantially similar Hildenbrand and Hanson solubility parameters to that of the etch mask 46 material. In an exemplary embodiment, it may also be important that the etch stop material leave substantially no residue on the clamping disk 22 during the etching process. Residue on the clamping disk 22 from the etch stop layer 54 may make it difficult to clamp and seal subsequent substrate 20 onto the clamping disk 22 and may adversely affect the cooling capability of the clamping disk 22 as described above.

A suitable etch stop layer 54 may be provided by a material having the following properties:

1. Resistance to etch gases
2. Resistant to cracking
3. Good adhesion to the wafer surface it is coated on (backside in our current process)
4. Low tendency to transfer to the surface of the clamping disk 22
5. Good solubility in the solvent that is used to strip the etch mask Materials which may be used as the etch stop material for the etch stop layer 54 include, but are not limited to, epoxy resins, polyhydroxystyrene resins, polyurethane coating materials, acrylic-based coating materials, cresol-novolac resins, polyvinyl acetate coatings, polyester coatings, and polyamide coatings which are substantially devoid of photoactivation catalysts. Such a material may be applied to the second surface 52 of the substrate 20, such as by spin coating, spray-coating, extrusion coating, knife coating, and dry film laminating the material onto the substrate surface 52.

In an exemplary embodiment, a simple solution of a base polymer used in the etch mask photoresist formulation may be used as the material for the etch stop layer 54. For example, if the etch mask material is a polyhydroxy styrene based formulation, then a simple solution of polyhydroxy styrene may be used as an etch stop material. Since the etch stop layer 54 is not photodefined, the etch stop material does not require the presence of photoactive components.

Specific examples of materials which may be used to provide the etch stop layer 54 and the base polymer for the etch mask layer 48 are as follows:

(1) The use of a commercially available epoxy resin based coating available from Shell Chemical Company of Houston, Tex. under the trade name EPON 828 wherein the epoxy resin based coating contains a minimum amount of curing agent. The amount of curing agent is selected to provide a slightly cross-linked layer 54 after thermal curing. The above described chemically amplified, epoxy based negative resists available from MicroChem under the trade name SU8 is comparable to the EPON 828 expoxy resin.

(2) The use of a polyhydroxy styrene based coating dissolved in acetophenone or propylene glycol methyl ether acetate (PGMEA) for spin coating onto the wafer 18.

(3) The use of a commercially available polyurethane based coating available from Noveon, Inc. of Cleveland, Ohio under the trade name ESTANE TPU.

4) The use of a commercially available acrylic based coating such as a thermoplastic acrylic resin available from Rohm & Haas of Philadelphia, Pa. under the trade name ACRYLOID B-72.

(5) The use of commercially available acetone soluble coatings, including but not limited to, cresol-novolac resin based coatings, polyvinyl acetate based coatings, selected polyester based coatings, selected nylon based coatings, and the like.

Typically, the etch stop layer 54 will have an overall thickness T ranging from about 10 to about 40 microns. The layer 54 made with one of the foregoing materials is easy to remove after the DRIE process by dissolving the layers 46 and 54 in acetone.

In other exemplary embodiments, substantially the same chemical formulations may be used for the etch mask layer 46 and the etch stop layer 54, however, the etch mask layer 46 includes the photoinitiator whereas the etch stop layer 54 is substantially devoid of a photoinitiator.

The weight percent solids in these polymer solutions can range from about 10 wt. % to about 50 wt. %. In addition to the solvent, the epoxy resin formulation used as the etch mask layer 46 may contain from about 0.5 to about 2 wt. % of a conventional UV-curing agent such as a mixture of triarylsulfonium hexafluoroantimonate salt, commercially available from Union Carbide Corporation of Danbury, Conn. under the trade name CYRACURE UVI-6974.

The foregoing etch stop materials are typically spin-coated onto the second surface 52 of the wafer 18 from a solution of the polymer in a volatile solvent. In the alternative, wafer processing tapes made of one or more of the foregoing polymeric materials may be used.

Figure 5A:
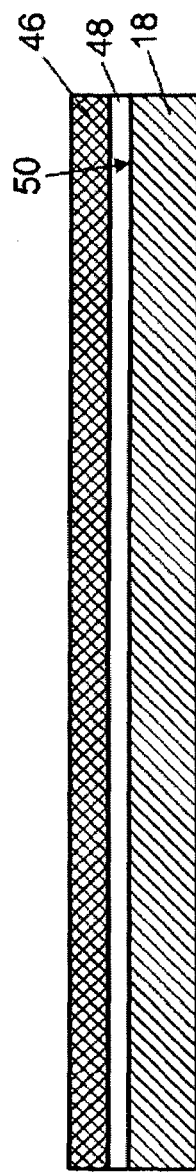
FIGS. 5A-5E are schematic diagrams for a dry etching process according to an exemplary embodiment of the disclosure.
Figure 5B:
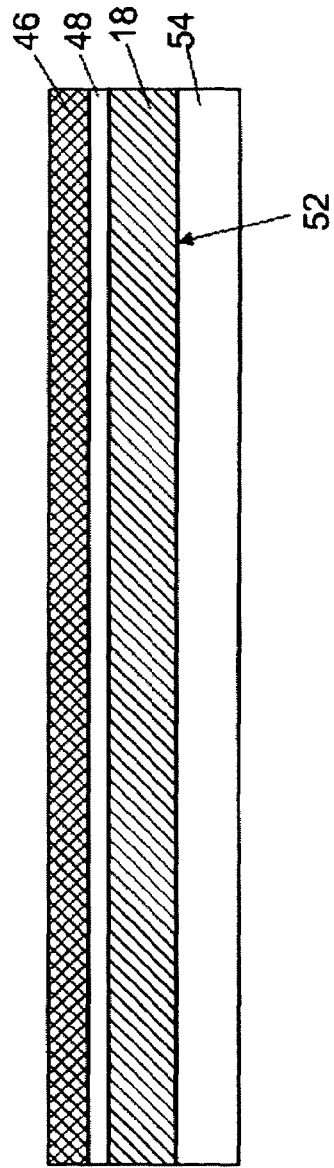
Figure 5C:
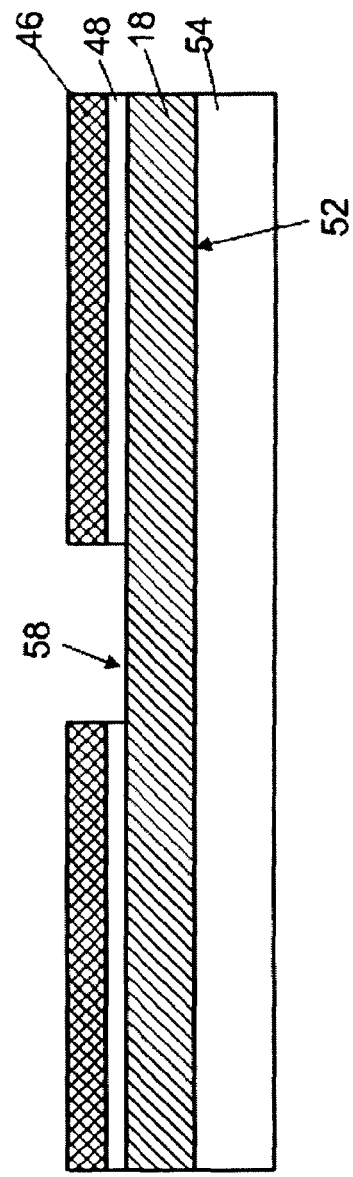
Figure 5D:
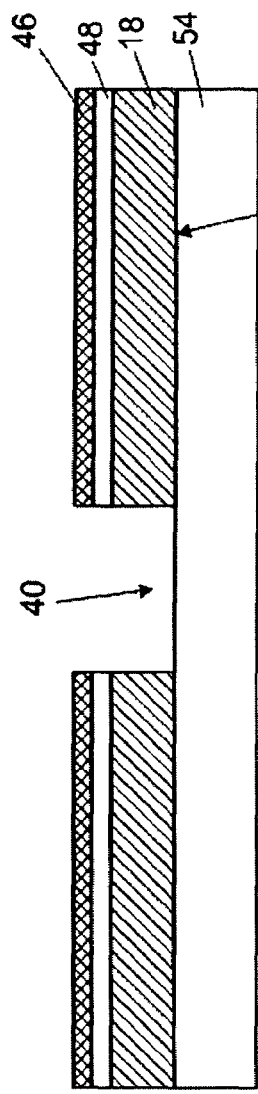

After the etch stop material is applied to the substrate 20 to provide the etch stop layer 54, the etch mask 46 may be patterned and developed as shown in FIG. 5C to provide a location 58 for the slot 40 (FIG. 5D) to be etched through the substrate 20 up to the etch stop layer 54. After forming the slot 40, as shown in FIG. 5D, the etch stop layer 54 and the etch mask 46 are removed from the substrate 20 using a suitable solvent for the etch stop layer 54 and etch mask 46 to provide the structure shown in FIG. 5E.

Organic solvents which may be used to remove the etch mask layer 46 and the etch stop layer 54 include, but are not limited to, acetone, methyl ethyl ketone, n-methyl pyrrolidone, butyl acetate, propylene glycol methyl ether acetate (PGMEA), and acetophenone. Of the foregoing, acetone and butyl acetate are preferred solvents.

Figure 5E:
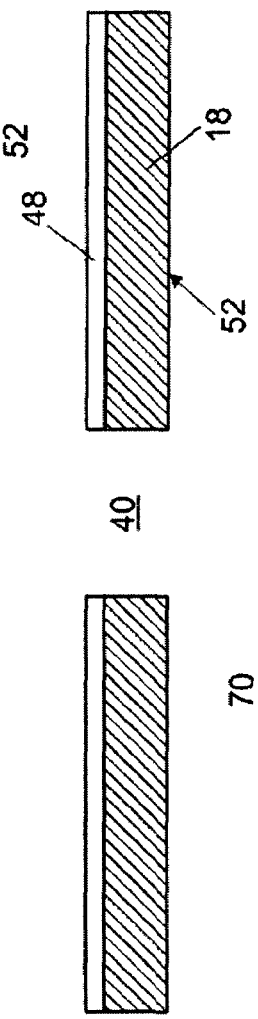

Semiconductor substrates 20 (FIG. 2) made from the wafers 18 containing the slots 40 as shown in FIG. 5E, may be used in a wide variety of applications including micro fluid ejection heads. A plan view of a portion of a micro-fluid ejection head 70 is illustrated in FIG. 6. The ejection head 70 includes a semiconductor substrate 20 and a nozzle plate 72 attached to the substrate 20. The substrate 20 may include a single or multiple fluid feed slots 40. A plurality of ejection devices 74, such as heater resistors, are adjacent the slots 40. Upon activation of the ejection devices 74, fluid is ejected through nozzle holes 76 in the nozzle plate 72.

Figure 7:
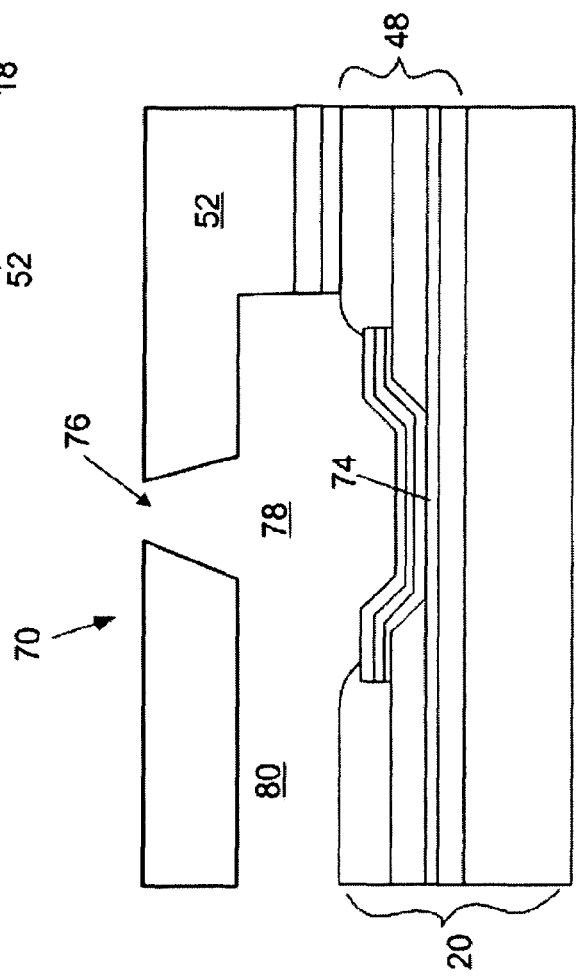
FIG. 7 is a cross-sectional view, not to scale, of a portion of the micro-fluid ejection head of FIG. 6.

A cross-sectional view, not to scale, of a portion of the micro-fluid ejection head 70 is illustrated in FIG. 7. The substrate 20 includes a plurality of layers 48 defining the plurality of ejection devices 74. The nozzle plate 72 includes the nozzle holes 76, a fluid chamber 78 and a fluid supply channel 80, collectively referred to as flow features, in fluid flow communication with the slot 40 for providing fluid to the ejection devices 74. The ejection head 70, as described above, may be used in a fluid ejection device such as an ink jet printer, wherein the fluid ejected is ink. Other micro-fluid ejection devices that may use the ejection head 70, without limitation, may include lubrication ejection heads, cooling ejection heads, and pharmaceutical ejection heads.

Having described various aspects and embodiments of the disclosure and several advantages thereof, it will be recognized by those of ordinary skills that the embodiments are susceptible to various modifications, substitutions and revisions within the spirit and scope of the appended claims.

The invention claimed is:

1. A process for etching a semiconductor substrate using a deep reactive ion etching process to produce slots in the substrate, the process comprising:

applying a first layer comprising a photosensitive material selected from the group consisting of epoxy resins, polyhydroxystyrene resins, polyurethane coating materials, acrylic-based coating materials, cresol-novolac resins, polyvinyl acetate coatings, polyester coatings, and polyamide coatings to a first surface of substrate to provide an etch mask material layer on the first surface of the substrate;

applying a non-photosensitive etch stop material selected from the group consisting of epoxy resins, polyhydroxystyrene resins, polyurethane coating materials, acrylic-based coating materials, cresol-novolac resins, polyvinyl acetate coatings, polyester coatings, and polyamide coatings to a second surface of the substrate to provide an etch stop material layer on the second surface of the substrate, wherein the first layer and etch stop material layer have similar solubilities in one or more organic solvents as predicted by a Hansen solubility parameter (HSP) and a Hilderbrand solubility parameter for each of the etch mask material layer and the etch stop material layer;

etching the substrate from the first surface of the substrate to provide a slot in the substrate; and removing the etch mask material layer and the etch stop material layer by contacting the first surface and the second surface of the substrate with a single organic solvent.

2. The process of claim 1, wherein the first layer and the etch stop material layer are selected from materials that are substantially soluble in acetone.

3. The process of claim 1, wherein the first layer and etch stop material layer are applied to the substrate by a process selected from the group consisting of spin coating, spray-coating, extrusion coating, knife coating, and dry film lamination.

4. The process of claim 1, wherein the organic solvent is selected from the group consisting of acetone, methyl ethyl ketone, n-methyl pyrrolidone, butyl acetate, propylene glycol methyl ether acetate (PGMEA), and acetophenone.

5. In a process for etching slots through a thickness of a semiconductor substrate using a deep reactive ion etching (DRIE) process, the improvement comprising:

applying a first layer comprising a photosensitive material selected from the group consisting of epoxy resins, polyhydroxystyrene resins, polyurethane coating materials, acrylic-based coating materials, cresol-novolac resins, polyvinyl acetate coatings, polyester coatings, and polyamide coatings to a first surface of the substrate to provide an etch mask material layer on the first surface of the substrate;

applying a second layer comprising a non-photosensitive material selected from the group consisting of epoxy resins, polyhydroxystyrene resins, polyurethane coating materials, acrylic-based coating materials, cresol-novolac resins, polyvinyl acetate coatings, polyester coatings, and polyamide coatings to a second surface of the substrate to provide an etch stop material layer on the second surface of the substrate, wherein the first layer and the second layer are soluble in one or more of the same organic solvents;

etching the substrate to provide a slots in the substrate; and subsequently, dissolving the first layer and the second layer by contacting the first surface and second surface of the substrate with a single organic solvent.

6. The improvement of claim 5, wherein the single organic solvent is selected from the group consisting of acetone, methyl ethyl ketone, n-methyl pyrrolidone, butyl acetate, propylene glycol methyl ether acetate (PGMEA), and acetophenone.

7. The improvement of claim 5, wherein the first layer and second layer are applied to the substrate by a process selected from the group consisting of spin coating, spray-coating, and dry film lamination.

* * * * *